United States Patent
Radens et al.

(10) Patent No.: US 6,509,624 B1
(45) Date of Patent: Jan. 21, 2003

(54) SEMICONDUCTOR FUSES AND ANTIFUSES IN VERTICAL DRAMS

(75) Inventors: Carl J. Radens, Lagrangeville, NY (US); Wolfgang Bergner, Stormville, NY (US); Rama Divakaruni, Somers, NY (US); Larry Nesbit, Williston, VT (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 47 days.

(21) Appl. No.: 09/675,246

(22) Filed: Sep. 29, 2000

(51) Int. Cl.[7] .............................................. H01L 29/00
(52) U.S. Cl. ........................ 257/530; 257/50; 257/529; 438/131; 438/467; 438/600
(58) Field of Search ................................ 257/529, 530, 257/532, 50; 438/131, 467, 600, 957; 365/96, 225.7

(56) References Cited

U.S. PATENT DOCUMENTS 6,339,559 B1 * 1/2002 Bertin et al. .................. 326/37
6,388,305 B1 * 5/2002 Bertin et al. .................. 257/513
6,396,121 B1 * 5/2002 Bertin et al. .................. 257/529

* cited by examiner

Primary Examiner—Steven Loke
Assistant Examiner—Donghee Kang
(74) Attorney, Agent, or Firm—Ratner & Prestia; H. Daniel Schnurmann (57) ABSTRACT

A structure and process for semiconductor fuses and antifuses in vertical DRAMS provides fuses and antifuses in trench openings formed within a semiconductor substrate. Vertical transistors may be formed in other of the trench openings formed within the semiconductor substrate. The fuse is formed including a semiconductor plug formed within an upper portion of the trench opening and includes conductive leads contacting the semiconductor plug. The antifuse is formed including a semiconductor plug formed within an upper portion of the trench opening and includes conductive leads formed over the semiconductor plug, at least one conductive lead isolated from the semiconductor plug by an antifuse dielectric. Each of the fuse and antifuse are fabricated using a sequence of process operations also used to simultaneously fabricate vertical transistors according to vertical DRAM technology.

11 Claims, 4 Drawing Sheets

SEMICONDUCTOR FUSES AND ANTIFUSES IN VERTICAL DRAMS

TECHNICAL FIELD

The present invention relates most generally to integrated circuits. More particularly, the present invention relates to apparatuses and methods for providing fuses and antifuses in integrated circuit devices.

BACKGROUND OF THE INVENTION

In integrated circuit manufacturing, it is often desirable to select particular circuits from an array. For example, redundant parallel circuits may be formed and, after testing one circuit to verify that it functions properly, the other parallel circuit may be removed. Similarly, a parallel circuit which is normally isolated from other circuit elements may be added if needed. One method currently used to remove an unwanted circuit is to form programmable fuse elements in the circuit which are normally closed, then "blow" a fuse element with energy to open the circuit that is not selected. A method currently used to add a desired circuit is to form a programmable antifuse element in a circuit which is normally open then "blow" the antifuse element with energy to close the circuit which has been selected.

Various fuses and antifuses are provided in the conventional art in order to provide for redundant circuits or features to be selected or de-selected as appropriate. Many of the conventional fuses and antifuses formed within integrated circuit devices require the application of energy by means of external intervention into the integrated circuit. External power sources such as lasers are generally undesirable as they require the physical intervention of an external physical energy source which must be directed to a particular circuit feature, the alignment of which is very difficult to achieve, and they can also cause contamination when the fuse or antifuse element is blown. As such, fuses or antifuses which require power applied through external intervention, are generally not desirable. Thus, fuse or antifuse elements which are provided within the integrated circuit and which can be electrically programmed to blow, are more desirable.

In today's advancing integrated circuit manufacturing industry, the trend is towards the vertical integration of device features. Trench openings are formed within semiconductor substrates and various devices may be formed within the trench openings. These devices are vertically integrated downward into the substrate. An example of such a feature integrated into a trench opening is a trench capacitor which is commonly used in the integrated circuit manufacturing industry. Another feature provided in "vertical DRAM" technology, is a vertical transistor provided within a trench opening. A polysilicon or other semiconductive material is used as a plug formed within the trench opening and also serves as the transistor gate. In advanced integration schemes, a single trench opening may include both a trench capacitor formed in the lower portion of a particular trench opening, and a vertical trench transistor formed above and isolated from the trench capacitor, also in the same trench opening.

It would therefore be advantageous to incorporate the formation of fuses and antifuses into vertical DRAM processing technology. As such it is an object of the present invention to provide a method and structure which integrates fuse and antifuse structures into vertical DRAM processing technology.

SUMMARY OF THE INVENTION

To achieve these and other objects, and in view of its purposes, the present invention provides semiconductor fuses and antifuses formed within trench structures and which are formed using the process scheme also used to simultaneously form vertical trench transistors using vertical DRAM process technology.

The fuse element includes a polysilicon or other semiconductor material formed within an upper portion of a trench opening and which includes two conductive leads coupled to the top surface of the plug. In response to a predetermined voltage potential applied across the leads, the polysilicon or other semiconductor material "blows" and ceases to become conductive. In this manner a circuit may be opened.

In the antifuse, a thin dielectric layer such as silicon nitride serves as the antifuse element. In the antifuse, as in the fuse, a plug of polysilicon or another semiconductor material formed within the top portion of a trench opening is coupled to a first lead and is isolated from a second lead by means of the dielectric antifuse element. In response to a predetermined voltage potential applied across the leads, the antifuse dielectric element "blows" and allows for the conductive lead formed above it to be coupled to the plug formed of polysilicon or another semiconductor material formed below it. In this manner, the circuit becomes closed.

The present invention also provides a method for forming both the fuse and the antifuse structures. The method utilizes the sequence of process operations used to simultaneously form vertical trench transistors and the like, in other trench openings formed within the substrate. The polysilicon or other semiconductor material which is used as the gate electrode for vertical transistors formed in some trench openings, is also used to form the plug which forms either the fuse element, in the case of the fuse structure, or which contacts the dielectric antifuse element, in the case of the antifuse structure.

It is to be understood that both the foregoing general description and the following detailed description are exemplary, but not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 4–9 are cross-sectional views illustrating a process sequence used to form an antifuse according to the present invention:

FIGS. 11–13 are cross-sectional views showing the sequence of process operations used to form a fuse structure according to the present invention.

FIG. 13 shows the structure shown in FIG. 12 after an insulating material has been added.

DETAILED DESCRIPTION OF THE INVENTION

Figure 1:
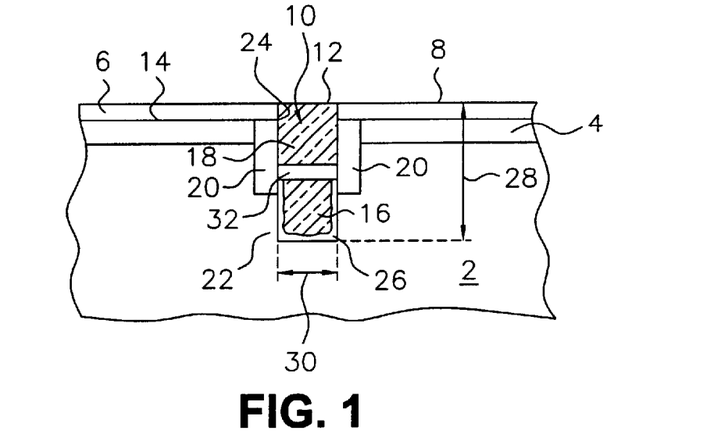
FIG. 1 is a cross-sectional view of a first exemplary embodiment of a substructure onto which the fuse or antifuse structure of the present invention may be incorporated.
Figure 2:
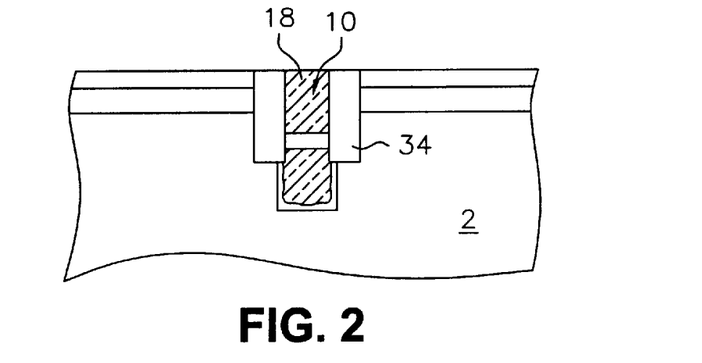
FIG. 2 is a cross-sectional view of a second exemplary embodiment of a substructure onto which the fuse or antifuse structure of the present invention may be incorporated.
Figure 3:
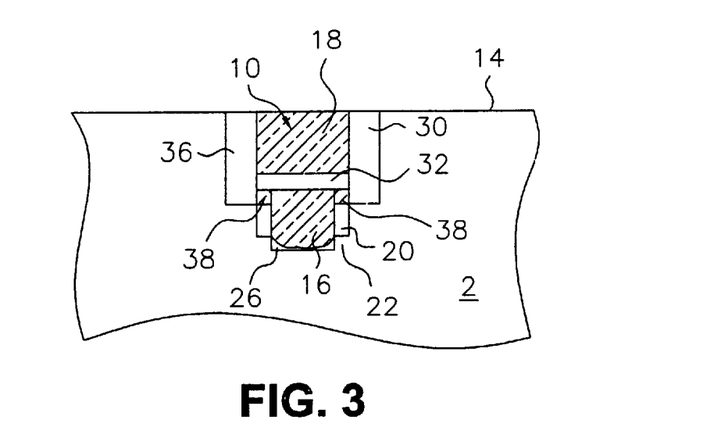
FIG. 3 is a cross-sectional view of a third exemplary embodiment of a substructure onto which the fuse or antifuse structure of the present invention may be incorporated.

The fuse and antifuse structures of the present invention may be fabricated onto various substructures. Examples of such substructures are shown in FIGS. 1–3. A consistent feature among the various embodiments is that they each include a semiconductor plug such as polysilicon which fills the upper portion of a trench opening formed within a semiconductor substrate. The plug of semiconductor material is isolated laterally from the substrate and from subjacent structures also included within the trench opening.

The plug formed of semiconductor material and which fills the upper portion of the trench opening may be used as part of a fuse structure or an antifuse structure. In the case of the fuse structure, two conductive leads will be formed coupled to the top surface of the plug of semiconductor material. In the case of the antifuse, conductive leads will be formed above the top surface of the plug of semiconductor material, and at least one of the leads will be electrically insulated from the plug by means of thin dielectric film which serves as the antifuse. This dielectric film become mechanically degraded, or "blown", to provide for the two leads to be coupled to each other through the plug of semiconductor material. In this manner, the antifuse dielectric film breaks down.

As is known in the art, a fuse blows in response to a predetermined voltage potential or energy being applied across the terminals of the fuse element. As applied to the present invention, when the predetermined voltage potential or energy is applied across the fuse, the plug of semiconductor material formed within the trench explodes or melts and ceases to provide connection between the two terminals. It should be understood that the features, sizes, and material properties of the fuses, are chosen in conjunction with the predetermined voltage potential or energy which will be used to blow the fuse, and also in conjunction with the operating characteristics of the semiconductor device.

Similarly for antifuses, features, sizes and material qualities are chosen so that the dielectric film which serves as the antifuse element, blows according to a predetermined voltage potential applied across the antifuse terminals and not during the normal operation of the device in which the antifuse in included. When the antifuse dielectric blows, it becomes mechanically defective and allows for contact between the plug of semiconductor material below the dielectric film and the conductive materials formed above the dielectric film.

Now turning to the figures, FIG. 1 is an exemplary embodiment of a substructure on which a fuse or antifuse may be formed, according to the present invention. FIG. 1 shows trench opening 10 formed within semiconductor substrate 2. Semiconductor substrate 2 may be a conventional semiconductor substrate such as a silicon wafer commonly used in the semiconductor manufacturing industry, but other substrates may be used alternatively. In the exemplary embodiment shown in FIG. 1, upper portion 4 of substrate 2 may be an N+ doped active area. Oxide film 6, which is formed over top surface 14 of substrate 2, may be referred to as trench top oxide (TTO) film 6. In the preferred embodiment, TTO film 6 may be a silicon dioxide film, but other dielectric films may be used in alternative embodiments. TTO film 6 may be formed to a conventional thickness as used in the art. According to various exemplary embodiments, TTO film 6 may include a thickness ranging from 10–100 nanometers. Trench opening 10 extends down from top surface 8 of TTO film 6 and into substrate 2. Dimensions such as depth 28 and width 30 of trench opening 10 may vary according to various exemplary embodiments. Depth 28 may range from 5–10 microns according to various exemplary embodiments and width 30 may range from 0.07 to 4.0 microns according to various exemplary embodiments.

In the exemplary embodiment of the substructure shown in FIG. 1, the lower portion of the trench opening is filled with semiconductor material 16 which is insulated from the surrounding substrate by insulating layer 26. According to an exemplary embodiment, semiconductor material 16 may form a first electrode of a trench capacitor and the surrounding region 22 of substrate 2 may form the other electrode. Insulating layer 26 serves as the capacitor dielectric.

Semiconductor plug 18 fills the upper portion of trench opening 10. According to the preferred embodiment, semiconductor plug 18 may be formed of a polysilicon (polycrystaline silicon) material as commonly used in the art. It can be seen that upper surface 12 of semiconductor plug 18 is essentially coplanar with top surface 8 of TTO film 6. The shown structure may be formed by a polishing procedure carried out after the upper portion of trench opening 10 has been filled with semiconductor material, then a polishing operation such as chemical mechanical polishing, has been carried out to substantially planarize the surface. Semiconductor plug 18 is isolated from beneath by insulating segment 32 formed within the trench opening. Insulating segment 32 may be formed as part of TTO film 6. Trench opening 10 also includes sidewalls 24 and it can be seen that semiconductor material 18 is isolated laterally from substrate 2 by means of a collar oxide film 20 which is formed within the substrate and surrounding the trench opening. Collar oxide film 20 may be formed using conventional methods and forms sidewalls 24 of trench opening 10 into which semiconductor material 18 is added. According to a preferred embodiment, collar oxide 20 may be a silicon dioxide film formed by oxidizing sidewalls 24 of trench opening 10. Collar oxide 20 may include a thickness ranging from 5 to 50 nm.

FIG. 2 shows another exemplary embodiment of a substructure onto which a fuse or antifuse structure may be incorporated. The embodiment shown in FIG. 2 differs from that shown in FIG. 1 in that it includes dielectric isolation trench 34 which bounds trench opening 10. As in FIG. 1, semiconductor plug 18 fills the upper portion of trench opening 10.

At this point it should again be stressed that the exemplary embodiments shown in FIGS. 1 and 2 are just that—exemplary. The fuse and antifuse structures of the present invention may be integrated into vertical DRAM processing technology by using a plug of semiconductor material formed within the upper portion of a trench opening and which is insulated laterally from the substrate and beneath from any further features formed within the trench opening. Semiconductor plug 18 shown in FIGS. 1 and 2, is an example of such a plug. A fuse or antifuse may be formed using such a plug, by forming a duality of leads above the top surface of the plug, as will be shown and described.

An advantage of the present invention is that the fuse or antifuse structure which utilizes the top semiconductor plug which fills the trench opening, is formed using the same sequence of process operations also used to form a deep trench capacitor/vertical trench transistor such as that shown in FIG. 3. Trench opening 10 shown in FIG. 3 includes upper semiconductor plug 18 which forms the gate of a vertical transistor. Semiconductor plug 18, which forms the gate of the vertical transistor shown in FIG. 3, may be formed from a single film, other portions of which form plugs in other trench openings which may be used to form fuses or antifuses according to the present invention.

Still referring to FIG. 3, shallow n-well region 36 surrounds semiconductor plug 18 formed in trench opening 10. A gate oxide film (not shown) is formed between shallow n-well region 36 and semiconductor plug 18. As in FIGS. 1 and 2, segment 32 of TTO oxide film 6 isolates semiconductor plug 18 from the capacitor formed below it. The capacitor includes the features as described above in conjunction with FIG. 1. Additionally, buried strap 38 is provided to couple semiconductor material 16 which forms a capacitor electrode, to shallow n-well region 36.

According to an alternative embodiment, the structure shown in FIG. 3 may also be used as a substructure onto which a fuse or antifuse structure may be formed.

Antifuse Embodiment

FIGS. 4–9 show the sequence of processing operations used to form antifuse structures according to various exemplary embodiments. For simplicity, only the upper portion of the substructure formed within the trench opening is shown. As discussed above, the trench opening may include various other features which may be included within the lower portion of the trench opening and/or which may surround the trench opening.

Figure 4:
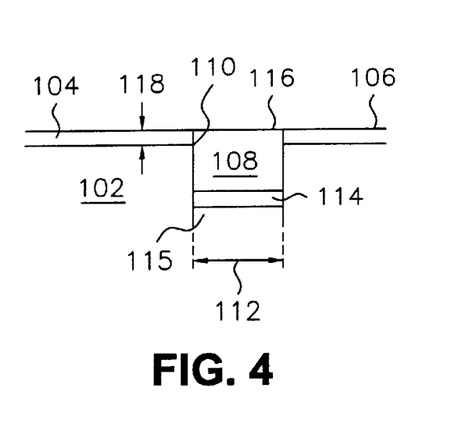
FIG. 4 shows a plug of semiconductor material formed within a trench opening.

Referring now to FIG. 4, semiconductor substrate 102 may be a conventional semiconductor substrate such as a silicon wafer commonly used in the semiconductor manufacturing industry. Other substrates may be used alternatively. Dielectric film 104 which may be a TTO film as described in conjunction with FIG. 1, is formed over semiconductor substrate 102. Trench opening 110 extends down from top surface 106 of dielectric film 104. According to an exemplary embodiment in which dielectric film 104 is a TTO film, dielectric film 104 may include a thickness 118 ranging from 10–100 nanometers (nm). Within trench opening 110, semiconductor material 108 is formed within the upper portion of trench 110 and is isolated by means of insulating layer 114 which may be a segment of dielectric film 104, from features such as conductive material 115 which may be formed within trench opening 110 and beneath semiconductor plug 108. Trench opening 110 includes width 112. Width 112 of trench opening 110 may vary from 0.07 to 4.0 microns according to various exemplary embodiments.

According to a preferred embodiment, semiconductor plug 108 will be a polysilicon material. According to alternative exemplary embodiments, semiconductor materials other than polysilicon may be used. According to various exemplary embodiments wherein a polysilicon material is used as semiconductor plug 108, the polysilicon material may be doped as necessary. Various methods may be used to form the structure shown in FIG. 4. According to an exemplary embodiment, a substructure is formed within trench opening 110, with the portion of the trench opening above insulating layer 114 being void. A semiconductor material is formed over top surface 106 of dielectric film 104 and filling the upper (void) portion of trench opening 110. A polishing operation such as CMP (chemical mechanical polishing) is used to planarize the structure and produce semiconductor plug 108 which includes top surface 116 which is substantially planar with top surface 106 of dielectric film 104.

In addition to being insulated from below by means of insulating layer 114, it should be understood that semiconductor plug 108 is insulated laterally from semiconductor substrate 102 by means of an insulating material such as the collar oxide film 20 shown in FIG. 1. For purposes of clarity and simplicity, this laterally insulating material is not shown in FIGS. 4–9.

Figure 5:
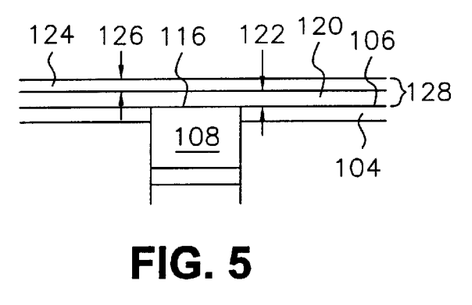
FIG. 5 shows the structure in FIG. 4 after a dielectric film and a conductive polysilicon film have been added.

Now turning to FIG. 5, antifuse dielectric film 120 is formed over the structure shown in FIG. 4, including over top surface 106 of dielectric film 104 and top surface 116 of semiconductor plug 108. According to the preferred embodiment, antifuse dielectric film 120 may be a silicon nitride film. The silicon nitride film of the preferred embodiment may be a stoichiometric silicon nitride film, $Si_3N_4$, or it may be a non-stoichiometric combination of silicon and nitride. According to various other exemplary embodiments, antifuse dielectric film 120 may be a silicon oxynitride ($SiO_xN_y$) film or other thin dielectric films such as oxides doped with arsenic, boron, or phosphorous, $Al_2O_3$, or dielectric materials such as amorphous carbon and hydrogen-containing amorphous carbon. According to various exemplary embodiments, thickness 122 of antifuse dielectric film 120 may range from 3 to 20 nm, but other film thicknesses may be used alternatively.

Gate conductor polysilicon (GC poly) film 124 is formed over antifuse dielectric film 120. GC poly film 124 will be a polysilicon film sufficiently doped to provide good conduction characteristics. Various dopant impurities may be used to dope GC poly film 124 using conventional methods. GC poly film 124 may include a thickness ranging from 5–200 nm according to various exemplary embodiments. Antifuse dielectric film 120 and GC poly film 124 combine to form first composite layer 128.

It should be emphasized again, at this point, that an advantage of the present invention is that the process sequence shown for forming the antifuse devices shown in FIGS. 4–9, is also used for simultaneously forming various other structures in other trench openings simultaneously. For example, in another trench opening (not shown) which may include a shallow n-well region surrounding the trench as shown in FIG. 2, the material which is used to form semiconductor plug 108 in FIG. 4, may also be used to form the gate of a vertical transistor formed within the other trench opening.

Figure 6:
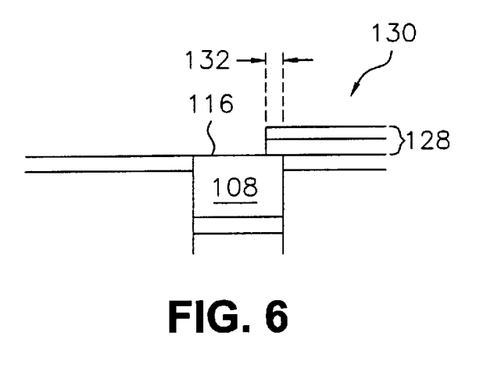
FIG. 6 shows the structure in FIG. 5 after a portion of the added films have been removed according to a first exemplary embodiment.

Now turning to FIG. 6, it can be seen that portions of original first composite layer 128 have been removed. Conventional patterning and etching techniques may be used to produce the structure shown in FIG. 6. According to an exemplary embodiment, a photosensitive masking material may be formed over first segment 130 of first composite film 128, then an etching procedure carried out to remove sequentially exposed portions of GC poly film 124, then antifuse dielectric film 120. First segment 130 of first composite film 128 will form a first lead or terminal of the antifuse structure being formed. First segment 130 of first composite film 128 overlaps semiconductor plug 108 by overlap distance 132. Overlap distance 132 may vary from 0.035 to 40 microns according to various exemplary embodiments. According to the preferred embodiment, overlap distance 132 may range from 0.5 to 10.0 times the minimum feature size capable of being produced using the patterning and etching techniques used.

Figure 6A:
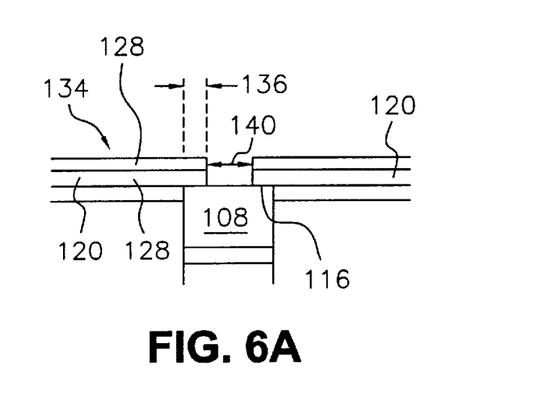
FIG. 6A shows the structure in FIG. 5 after a portion of the added films have been removed according to a second exemplary embodiment.

FIG. 6A shows an alternative embodiment in which two segments of first composite layer 128 remain after patterning. In the embodiment shown in FIG. 6A, second segment 134 of first composite layer 128 is also formed over portions of top surface 116 of semiconductor plug 108. Second segment 134 of first composite layer 128 overlaps semiconductor plug 108 by overlap distance 136 which may be of the same dimensions stated in conjunction with overlap distance 132 shown in FIG. 6. It can be seen that the exemplary antifuse structure which will be formed from the structure shown in FIG. 6A will include two antifuse elements because two different segments of antifuse dielectric film 120 are included. Each segment of antifuse dielectric film 120 creates an open in the antifuse. Gap spacing 140 may be about 0.12 microns according to an exemplary embodiment, but other gap spacings ranging from 0.1 to 1.0 microns may be used alternatively, depending on other physical dimensions of the antifuse structure. For example, gap spacing 140 will be chosen in conjunction with overlap distances 132 and 136 as well as trench width 112.

Figure 7:
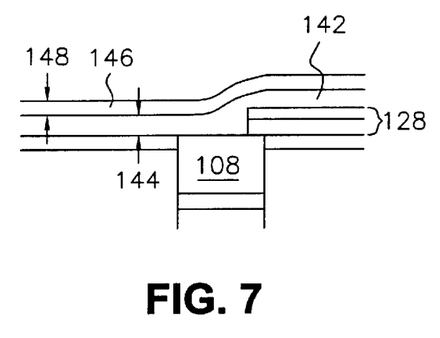
FIG. 7 shows the structure in FIG. 6 after a duality of films have been added.

FIG. 7 shows the structure previously shown in FIG. 6, after conductor film 142 and cap film 146 have been sequentially added. According to various exemplary embodiments, conductor film 142 may be a film formed of a heavily doped and conductive polysilicon material, copper, titanium, tungsten, or various other conductive silicide or salicide films. According to another exemplary embodiment, conductor film 142 may be aluminum. Conductor film 142 will be chosen to have a low sheet resistance and therefore a high conductivity. Thickness 144 of conductor film 142 may vary from 5 to 200 nm according to various exemplary embodiments. Other thicknesses may be used in alternative embodiments. Conductor film 142 may be formed using conventional methods. Over conductor film 142, cap film 142 may be formed. According to an exemplary embodiment, cap film 146 may be formed of silicon nitride but other insulating materials may be used alternatively. Conventional formation methods may be used. Cap film 146 includes thickness 148 which may range from 100–500 nm according to various exemplary embodiments. After films 142 and 144 have been formed as shown, a photolithographic pattern may be formed using a masking film and conventional methods. Portions of the composite film including conductor film 142 and cap film 146, are then removed using conventional etching methods.

Figure 8:
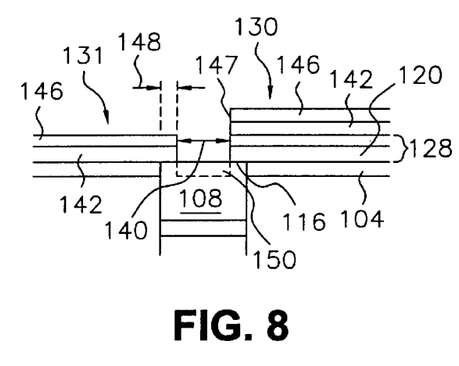
FIG. 8 shows the structure in FIG. 7 after portions of the duality of films added in FIG. 7 have been removed according to a first exemplary embodiment.

FIG. 8 shows the structure after an etching procedure has been carried out to remove portions of cap film 146 and conductor film 142. The structure includes two opposed segments 130 and 131. First segment 130 includes portions of first composite layer 128, conductor film 142, and cap film 146. According to an alternative embodiment, not shown, the edges 147 of films 128, 142, and 146 of first segment 130 may not be co-linear and there may be an "underlap" region in which films 142 and 146 are recessed slightly to the right-hand side as shown in FIG. 8 and which therefore produces a lip of first composite film 128 (not shown) which is exposed to the top. Gap spacing 140 between opposed segments 131 and 130 is as described in conjunction with FIG. 6A It can be seen that each of first segment 130 and second segment 131 additionally extend over semiconductor substrate 102 to provide electrical coupling to other circuit features.

The conductive portion of first segment 130 is insulated from semiconductor plug 108 by means of antifuse dielectric film 120. In contrast, second segment 131 includes conductor film 142 which directly contacts top surface 116 of semiconductor plug 108. As such, second segment 131 is electrically coupled to semiconductor plug 108. It can be therefore seen that the structure shown in FIG. 8 forms an antifuse and that segments 130 and 131 which may be considered leads or terminals of the antifuse structure are insulated from each other by means of antifuse dielectric film 120. Depending on the etch process used, the selectivity of the etching process, and the accuracy of the endpoint determination, top surface 116 of semiconductor plug 108 may be recessed in the exposed area to form recessed region 150, outlined by the dashed lines. Overlap distance 148 of second segment 131 may be of the same dimensions as described in conjunction with overlap distances 132 and 136 in FIGS. 6 and 6A.

Figure 8A:
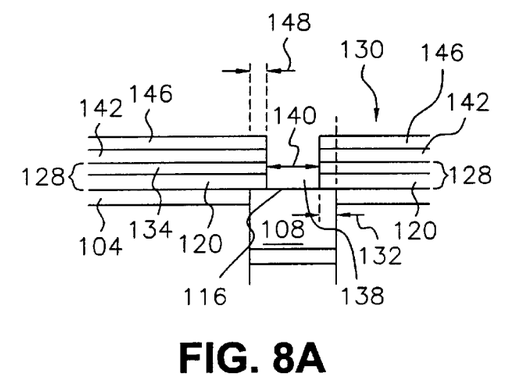
FIG. 8A represents a second exemplary embodiment showing the duality of films added to the structure shown in FIG. 6A, then patterned.

FIG. 8A shows an alternative embodiment of an antifuse structure. The structure shown in FIG. 8A differs from that shown in FIG. 8 because the structure shown in FIG. 8A includes two antifuse structures. The exemplary structure shown in FIG. 8A may be fabricated using the structure shown previously in FIG. 6A, then forming conductor film 142 and cap film 146 over the structure, then patterning using conventional methods. The antifuse structure shown in FIG. 8A includes first segment 130 and second segment 134 which may be considered leads or terminals of the antifuse structure, and segments 130 and 134 are each isolated from semiconductor plug 108 by means of antifuse dielectric film 120 which insulates the conductive portions of segments 130 and 134 from top surface 116 of semiconductor plug 108.

Figure 9:
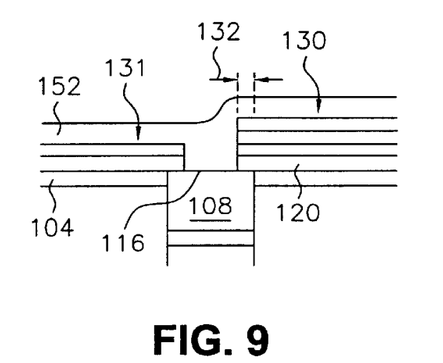
FIG. 9 shows the structure in FIG. 8 after an insulating material has been added.

Now turning to FIG. 9, the antifuse structure in FIG. 8 is shown after insulating material 152 has been formed over the structure including over the exposed top surface 116 of semiconductor plug 108 as well as over segments 130 and 131. It can be seen that the antifuse structure shown in FIG. 9 includes opposed segments 130 and 131 which serve as leads or terminals of the antifuse structure. Antifuse dielectric layer 120 and dielectric film 104 dictate that the terminals represented by segments 130 and 131 are electrically insulated from each other. The electrical and physical characteristics of the materials used to form the structure, the dimensions such as the thickness of antifuse dielectric layer 120 and overlap distance 132 are chosen in conjunction with the operating characteristics of the integrated circuit in which the antifuse is included and also in conjunction with the predetermined voltage potential to be applied across segments (terminals) 130 and 131 to blow the antifuse.

When such a predetermined voltage potential is applied across terminals 130 and 131, antifuse dielectric film 120 becomes physically defective and enables the conductive portions of first segment 130 formed above antifuse dielectric film 120, to become physically m contact and electrically coupled to semiconductor plug 108 through top surface 116. In this manner, a predetermined voltage potential can be applied to blow the antifuse structure shown and to close the circuit including segments or terminals 130 and 131. The predetermined voltage potential at which the antifuse will blow is, in turn, determined by the various operating potentials of the semiconductor device to insure that the antifuse only blows when the predetermined voltage potential is applied.

The above principles and considerations also apply to the antifuse structure previously shown in FIG. 8A and which includes two portions of antifuse dielectric layer 120 which must be blown by a predetermined voltage potential applied across the antifuse terminals.

Figure 10:
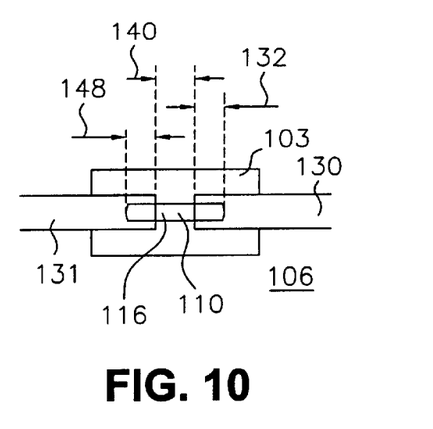
FIG. 10 is a plan view of the antifuse structure shown in FIG. 9.

FIG. 10 shows a top view of an exemplary embodiment of an antifuse structure such as that shown in FIG. 9. Filled trench opening 110 is formed within the semiconductor substrate and extends down from top surface 106 of dielectric film 104 (as shown in FIG. 9). Above top surface 106 and also above top surface 116 of semiconductor plug 108 (shown in FIG. 9), segments 130 and 131 are formed. Conductive segments 130 and 131 which may be considered terminals of the antifuse, are separated from each other by gap spacing 140. Segments 130 and 131 overlap trench opening 110 by overlap distances 132 and 148 respectively.

Fuse Embodiment

Figure 11:
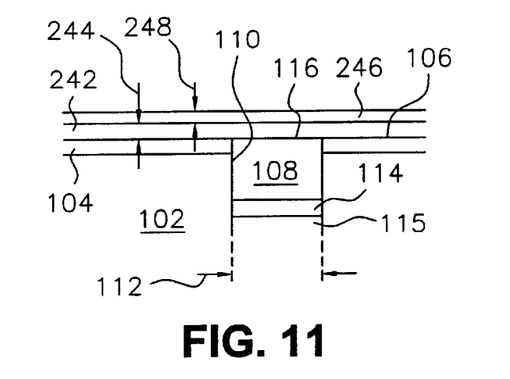
FIG. 11 shows a conductive film and an insulating film formed over a plug of semiconductor material formed within a trench opening within a substrate.
Figure 12:
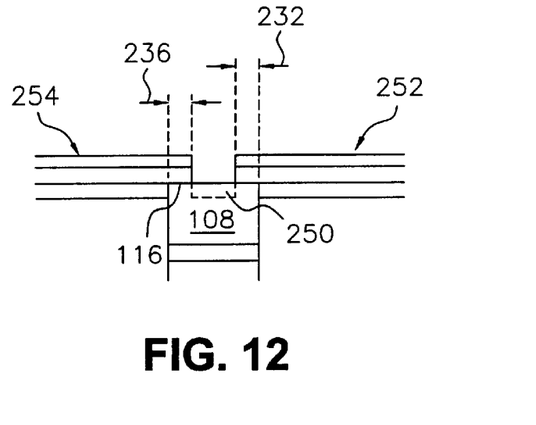
FIG. 12 shows the structure in FIG. 11 after portions of the two films have been removed.

FIGS. 11–13 illustrate a sequence of process operations used to form an exemplary embodiment of a fuse structure according to the present invention. FIG. 11 shows trench opening 110 formed within semiconductor substrate 102. Within trench opening 110, semiconductor plug 108 fills the top portion of trench opening 110 and includes top surface 116. At this point the reader is reminded that like reference numerals refer to like elements throughout the figures. Alternatively stated, the other features shown in FIG. 11 are as described in conjunction with the previous figures. Over top surface 106 of dielectric film 104 and top surface 116 of semiconductor plug 108, conductor film 242 is formed. Cap film 246 is formed over conductor film 242. Each of conductor film 242 and cap film 246 are formed using conventional methods. Conductor film 242 includes thickness 244 which may range from 5 nm to 200 m according to various exemplary embodiments. Conductor film 242 is chosen to have a low sheet resistivity and may be formed of polysilicon, tungsten, aluminum, cobalt, or other conductive silicide or salicide materials. Cap film 246 may include a thickness 248 ranging from 100–500 nm. Cap film 246 may be formed of a silicon nitride or other dielectric material.

In addition to being insulated from below by means of insulating layer 114, it should be understood that semiconductor plug 108 is insulated laterally from semiconductor substrate 102 by means of an insulating material such as the collar oxide film 20 shown in FIG. 1. For purposes of clarity and simplicity, this laterally insulating material is not shown in FIGS. 11–13.

Now turning to FIG. 12, conventional patterning and etching procedures are carried out using a masking film to form the structure shown in FIG. 12. It can be seen that portions of each of cap film 246 and conductor film 242 have been removed from above top surface 116 of semiconductor plug 108. Composite film segments 254 and 252 result and each include a conductive film and may be considered opposed leads or terminals of a fuse structure. Composite film segments 254 and 252 each contact a portion of top surface 116 of semiconductor plug 108. First composite film segment 254 overlaps top surface 116 of semiconductor plug 108 by first overlap distance 236 and second composite film segment 252 overlaps top surface 116 of semiconductor plug 108 by second overlap distance 232. It can be seen that each of first composite film segment 252 and second composite film segment 254 additionally extend over semiconductor substrate 102 to provide electrical coupling to other circuit features.

It can be seen that each of first composite film segment 252 and second composite film segment 254 physically contact and are electrically coupled to semiconductor plug 108. Each of overlap distance 236 and overlap distance 232 may vary according to various exemplary embodiments and will be determined in conjunction with the minimal feature size produced according to the available technology. In an exemplary embodiment, each of overlap distance 232 and overlap distance 236 may range from 0.5 to 10.0 times the minimum feature size achievable, and may range from 0.035 to 40 microns. Also as described in conjunction with the antifuse embodiment, the etch process used to remove portions of films 246 and 242 above top surface 116 of semiconductor plug 108 may be such that an overetch results and void area 250 (outlined by the dashed line) may be formed to extend down from top surface 116 and into semiconductor plug 108.

Now turning to FIG. 13, insulating material 262 is formed over the structure shown in FIG. 12 and including filling gap 238 formed between composite film segments 254 and 252. Insulating layer 262 may be a conventional insulating material such as a nitride, oxide, or oxynitride according to the conventional art. Insulating layer 262 is formed to cover top surface 116 of semiconductor plug 108 and segments 254 and 252. It can be seen that the fuse structure shown in FIG. 13 includes conductive, composite film segments 252 and 254, each of which are physically in contact with and electrically coupled to semiconductor plug 108 formed within trench opening 110. Gap spacing 240 may be on the order of 0.12 microns according to an exemplary embodiment, but other gap spacings ranging from 0.1 to 1.0 microns may be used alternatively, depending on other physical dimensions of the fuse structure. The overlap distances, the gap spacing, the materials used, and the electrical and physical characteristics of the materials used are chosen in conjunction with the desired operating characteristics of the integrated circuit in which the fuse structure is included.

Composite film segments 252 and 254 may be considered leads or terminals of the fuse element. When a predetermined voltage potential is applied across terminals 252 and 254, current flows from one terminal to the other through fuse element which is semiconductor plug 108. In response to a predetermined voltage potential applied across terminals 252 and 254, fuse element 108 blows, i.e. melts, explodes, or becomes physically incongruent such that conductive segments (terminals) 252 and 254 are no longer electrically coupled to one another. The circuit is thereby opened. The predetermined voltage potential at which the fuse will blow is, in turn, chosen in conjunction with the various operating potentials of the semiconductor device to insure that the fuse only blows as necessary.

Figure 14:
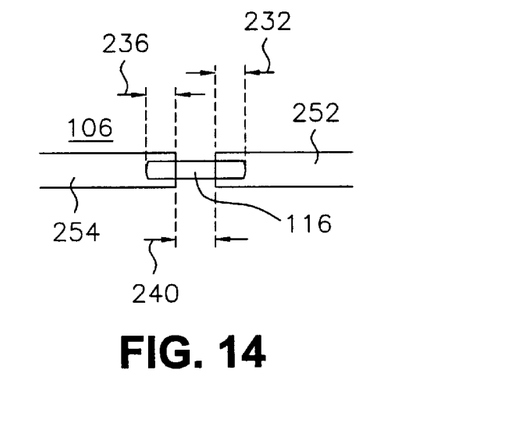
FIG. 14 is a plan view shown the fuse structure shown in FIG. 13.

FIG. 14 shows a plan view of the fuse structure shown and described in FIG. 13. Conductive film segments (terminals)

252 and 254 each overlap and contact top surface 116 of semiconductor plug 108 (see FIG. 13) which is formed to extend down into the semiconductor substrate which lies beneath top surface 106 of a dielectric film such as dielectric film 104 shown in FIG. 11. Segments 252 and 254 are separated by gap spacing 240. Segment 252 overhangs the polysilicon plug by overlap distance 232 and segment 254 overhangs the semiconductor plug by overhang distance 236.

The foregoing detailed descriptions are intended to be exemplary, not restrictive of the various embodiments of fuses and antifuses which may be formed according to the present invention. The trench substructure in which the semiconductor plug is formed, is not intended to be limited to the exemplary embodiments described herein. Rather, the semiconductor plug which is formed within a trench opening and onto which an antifuse or fuse structure is fabricated, may be formed within any of various trench substructures. Furthermore, the various structures, dimensions, and materials of the described embodiments, may be varied and still remain within the scope of the present invention. An advantage of the present invention is that for each of the fuse and antifuse, the structures can be formed using a process sequence used to simultaneously fabricate other devices such as vertical trench transistors in the same substrate.

The foregoing description of exemplary embodiments of the invention has been presented for the purposes of illustrating and describing the main points of the concepts of the invention. The present invention is not limited, however, to those embodiments. Rather, the scope of the present invention is as described by the appended claims.

What is claimed:

1. A semiconductor antifuse comprising a trench opening formed within a semiconductor substrate, a plug of semiconductor material filling an upper portion of said trench opening, a first segment of a conductive layer formed over a first portion of the top of said plug, a second segment of said conductive layer formed over a dielectric film which contacts a second portion of said top of said plug, said first segment separated from said second segment, wherein said dielectric film breaks down responsive to a predetermined voltage potential being applied across said antifuse and allows for electric coupling between said plug and said second segment of said conductive layer.

2. The semiconductor antifuse as in claim 1, wherein said first segment of said conductive layer and said second segment of said conductive layer comprise terminals of said antifuse, and wherein said voltage potential is applied across said terminals.

3. The semiconductor antifuse as in claim 1, further comprising an insulating layer formed within said trench opening and beneath said plug, and a trench capacitor formed beneath said insulating layer.

4. The semiconductor antifuse as in claim 1, further comprising an isolation collar of an insulating material formed along at least part of trench walls which define said trench opening and which electrically isolates said plug from said substrate.

5. The semiconductor antifuse as in claim 1, wherein said semiconductor material comprises polysilicon.

6. The semiconductor antifuse as in claim 1, wherein each of said first segment of said conductive layer and said second segment of said conductive layer extend over said substrate and are each separated from said substrate by an insulating layer interposed therebetween.

7. The semiconductor antifuse as in claim 1, further comprising a polysilicon film interposed between said second segment of said conductive layer and said dielectric film.

8. The semiconductor antifuse as in claim 1, further comprising remaining portions of the top of said plug being covered by an insulating material.

9. The semiconductor antifuse as in claim 1, wherein said first segment directly contacts said first portion of said top of said plug.

10. The semiconductor antifuse as in claim 1, further comprising a further dielectric film interposed between said first segment and said first portion of said top of said plug.

11. In a semiconductor device including a vertical transistor formed within a first trench opening formed within a semiconductor substrate and including a first plug of a polysilicon material formed within an upper portion of said first trench opening and functioning as a gate electrode of said vertical transistor, the improvement comprising an antifuse consisting of:

second plug formed of said polysilicon material formed within a second trench opening formed within said semiconductor substrate, a first discrete segment of a conductive layer formed over a first portion of the top of said second plug, a second discrete segment of said conductive layer formed over a dielectric film which contacts a second portion of said top of said second plug, said first segment separated from said second segment, remaining portions of the top of said second plug being covered by an insulating material, wherein said dielectric film breaks down responsive to a predetermined voltage potential being applied across said antifuse and allows for electrical coupling between said second plug and said second discrete segment of said conductive film.

* * * * *